United States Patent [19]

Kasukawa et al.

[11] Patent Number: 5,497,389
[45] Date of Patent: Mar. 5, 1996

[54] SEMICONDUCTOR LASER DEVICE HAVING AN ACTIVE LAYER AND A RESONATOR HAVING A SINGLE REFLECTOR OR PAIR OF REFLECTORS

[75] Inventors: Akihiko Kasukawa; Norihiro Iwai, both of Tokyo, Japan

[73] Assignee: The Furukawa Electric Co., Ltd., Tokyo, Japan

[21] Appl. No.: 265,875

[22] Filed: Jun. 27, 1994

[30] Foreign Application Priority Data

Jun. 25, 1993 [JP] Japan ................................. 5-180776

[51] Int. Cl.⁶ ..................................................... H01S 3/10
[52] U.S. Cl. ............................... 372/49; 372/34; 372/99
[58] Field of Search ................................ 372/49, 34, 33, 372/99

[56] References Cited

U.S. PATENT DOCUMENTS

| | | | |
|---|---|---|---|
| 4,839,901 | 6/1989 | Mozer et al. | 372/49 |
| 5,224,113 | 6/1993 | Tsang | 372/49 |
| 5,303,251 | 4/1994 | Zelenka | 372/29 |
| 5,369,658 | 11/1994 | Ikawa et al. | 372/49 |

*Primary Examiner*—James W. Davie
*Attorney, Agent, or Firm*—Jacobson, Price, Holman & Stern

[57] ABSTRACT

There are provided a semiconductor laser device equipped with improved reflectors at the opposite ends of the resonator and capable of preventing any rise in the laser oscillation threshold current and reduction in the quantum efficiency due to temperature rise and a laser module comprising such a semiconductor laser device that operates effectively and efficiently at high temperature and can be downsized at reduced cost. The reflector 23 or 26 disposed at either end of the resonator 22 of a semiconductor laser device 21 according to the invention have a reflectivity that increases with the oscillation wavelength of the device within a range ($\lambda_1$ to $\lambda_1$) as a function of the operating temperature of the device. A laser module 31 according to the invention comprises such a semiconductor laser device 21 as a principal component. The semiconductor laser device 21 and therefore the laser module 31 comprising such a device have an improved temperature dependency because its reflector loss is reduced as the device temperature rises.

10 Claims, 6 Drawing Sheets

SEMICONDUCTOR LASER DEVICE HAVING AN ACTIVE LAYER AND A RESONATOR HAVING A SINGLE REFLECTOR OR PAIR OF REFLECTORS

BACKGROUND OF THE INVENTION

1. Field of the Invention

This invention relates to a semiconductor laser device to be suitably used as a light source for optical telecommunications, optical instrumentation, optical data processing and other areas of application. The present invention also relates to a laser module comprising a semiconductor laser device according to the invention and associated components.

2. Prior Art

As is well known, semiconductor laser devices have applications in various technological fields including optical telecommunications, optical instrumentation and optical data processing and massive efforts are currently being paid to develop high-performance devices.

Quantum well type semiconductor laser devices are highly promising because of the low threshold current level they typically have for laser oscillation.

Like other semiconductor laser devices, the quantum well type semiconductor laser device has a threshold current level that varies as a function of temperature. As ambient temperature rises, the device loses its efficiency and its threshold current value. Firstly, this phenomenon will be described on the basis of known theories.

A semiconductor laser device to be used as a light source for optical telecommunications normally emits light with a wavelength in a 1.3 to 1.55 μm band. The temperature dependency of the threshold current level of such a device is approximately expressed by formula (1) below.

$$I_{th} \propto \exp(T/To) \tag{1}$$

where T[K] is the temperature of the active layer and To[K] is a characteristic temperature tentatively used to indicate the temperature dependency of the device, which is between 45 and 60K for ordinary use. Thus, with such a relatively small To, a semiconductor laser device that operates in the above wavelength band significantly changes its performance, as it is affected by ambient temperature.

On the other hand, a semiconductor laser device starts oscillating for laser emission when the gain of the resonator exceeds the total loss.

Formula (2) defined below defines the condition of oscillation, where Γ is the light confinement coefficient of the active layer, G is the gain in the laser resonator and total is the resonator loss, which is expressed by formula (3), where in is the internal loss of the active region and m is the reflectivity loss at the ends of the resonator, which is further expressed by formula (4), where $R_1$ and $R_2$ are the reflectivities of the respective ends of the resonator with a cavity length of L.

$$\Gamma G = \alpha_{total} \tag{2}$$

$$\alpha_{total} = \alpha_{in} + \alpha_{m} \tag{3}$$

$$\alpha_m = (1/2\Gamma) \times \ln(1/R_1R_2) \tag{4}$$

FIG. 8 shows a summary of an experiment for determining the device gain G conducted on quantum well type semiconductor laser devices having respective numbers of quantum wells of Nw=4, Nw=6 and Nw=8. Note that temperature is the sole parameter of the measurement.

From FIG. 8, the gain G of the quantum well laser device can be expressed by formula (5) below.

$$G = Go\{1 + \ln(J/Jo)\} \tag{5}$$

where Go is the gain coefficient, Jo is the transparent current density and J is the density of the injected electric current density.

FIG. 9 shows the temperature dependency of each of Go and Jo as defined above.

From FIG. 9 it is seen that both Go and Jo degrade with temperature rise.

Thus, from formulas (2) and (3), the threshold current level for laser oscillation of a semiconductor laser device rises with temperature.

FIG. 10 shows a schematic sectional view of a known quantum well type semiconductor laser device with a wavelength band of 1.3 to 1.55 μm.

The semiconductor laser device 1 of FIG. 10 has an active layer comprising a quantum well layer and is provided at an end thereof with a high reflectivity film 3 which is in fact a multilayer structure of a dielectric material in order to decrease the mirror loss $\alpha_m$. The high reflectivity film 3 shows a reflectivity as high as 95% or more for the entire oscillation wavelength band.

FIG. 11 shows the relationship among the electric current, the optical output and the temperature of a laser module comprising a semiconductor laser device 1 of the above described type as a principle component when it receives an injection signal.

As clearly shown in FIG. 11, the optical output of the module is $P_1$ at 30° C., whereas the average output level falls to $P_2$ at 70° C. along with the quenching ratio c expressed by formula (6) below.

$$\gamma = 10 \log P_{max}/P_{min} \tag{6}$$

As a common practice to avoid this problem, the laser device is normally held to a constant temperature by means of a temperature gauging means such as thermistor and a Peltier device, although the laser module and hence a system comprising such a laser module would become rather costly, because a Peltier device is very expensive.

FIG. 12 shows a schematic block diagram of a laser module comprising a known semiconductor laser device.

Referring to FIG. 12, the laser module 11 comprises a semiconductor laser device provided with a closed loop type drive circuit 14 including an AGC (Automatic Gain Control) circuit 12 and a monitor/optical receiver (photodetector) 13 in such a way that a bias current and a modulation current can be applied to the device 1.

The numeral 11 of FIG. 12 detects monitor light emitted from the back side of the semiconductor laser device 1 by the monitor/optical receiver 13 in order to maintain the average output and the quenching ratio to respective predetermined levels by means of the AGC circuit 12.

[Problem to be Solved by the Invention]

A quantum well type semiconductor laser device (with a wavelength band of 1.3 to 1.55 μm) illustrated in FIG. 10 shows a significant rise in the threshold current for laser oscillation to consequently reduce the quantum efficiency of the device when the ambient temperature rises. It is to be noted that semiconductor laser devices of other types are not free from this problem.

Laser systems comprising such a semiconductor laser device is normally provided with an external circuit such as an APC (Automatic Power Control) circuit in order to minimize the adverse effect of the rise in the ambient temperature. However, such an external circuit can make the system so much more complicated and hence costly. Therefore, it is highly desirable to develop measures to counter the adverse temperature effect on the semiconductor laser device that do not rely on an external circuit.

However, no noticeable technological development has been made in the study of the relationship between the operating temperature and the oscillation wavelength of a semiconductor laser device, trying to provide the device with improved reflectors at the ends of the resonator and optimally exploit the potential of the reflectors so that no external circuit may be required.

A laser module as illustrated in FIG. 12 requires a large and costly control circuit in order to adapt itself to the need of quickly picking up and processing the modulated current.

[Objects of the Invention]

In view of the above described circumstances, it is therefore an object of the invention to provide a semiconductor laser device equipped with improved reflectors at the opposite ends of the resonator and capable of preventing any rise in the laser oscillation threshold current and reduction in the quantum efficiency due to temperature rise. It is another object of the invention to provide a laser module comprising such a semiconductor laser device that operates effectively and efficiently at high temperature.

SUMMARY OF THE INVENTION

According to an aspect of the invention, the above and other objects are achieved by providing a semiconductor laser device comprising an active layer and a resonator having a single reflector, characterized in that the reflector is disposed at the end opposite to the optical emission end of the resonator and has a reflectivity that increases with wavelength within the oscillation wavelength band between $\lambda_1$ and $\lambda_2$, where $\lambda_1$ is the oscillation wavelength at the lowest operating temperature and $\lambda_2$ is the oscillation wavelength at the highest operating temperature of the device.

According to another aspect of the invention, there is provided a semiconductor laser device comprising an active layer and a resonator having a pair of reflectors, characterized in that one of the reflectors is disposed at the optical emission end and the other reflector is disposed at the opposite end of the resonator and the reflectors have respective reflectivities that increase with wavelength within the oscillation wavelength band between $\lambda_1$ and $\lambda_2$, where $\lambda_1$ is the oscillation wavelength at the lowest operating temperature and $\lambda_2$ is the oscillation wavelength at the highest operating temperature of the device.

The active layer of either of the above devices may preferably be a quantum well layer or a strain quantum well layer.

The reflectivity of each of said reflectors is preferably 50% or less for the oscillation wavelength of $\lambda_1$ and 70% or more for the oscillation wavelength of $\lambda_2$.

The reflector disposed at the optical emission end of either of the above devices may have a reflectivity smaller than that of the resonator disposed at the opposite end over the entire operating temperature range of the device.

If such is the case, the reflectivity of the reflector disposed at the optical emission end of the resonator is preferably 40% or less for the oscillation wavelength $\lambda_1$ and 70% or more for the oscillation wavelength $\lambda_2$ while the reflectivity of the reflector disposed at the opposite end is preferably 50% or less for the oscillation wavelength $\lambda_1$ and 80% or more for the oscillation wavelength $\lambda_2$.

The reflectors of either of the above semiconductor laser devices preferably have a multilayer structure of a dielectric material.

The dielectric multilayer structure of the reflectors may comprise dielectric films having a high refractive index and dielectric films having a low refractive index.

The dielectric multilayer structure preferably comprises a plurality of pairs of dielectric films, each having a high refractive index dielectric film and a low refractive index dielectric film.

Alternatively, the dielectric multilayer structure preferably comprises high refractive index dielectric films having a film thickness of $\lambda/4n_1$, low refractive index dielectric films having a film thickness of $\lambda/4n_2$ and a low refractive index dielectric film having a film thickness of $\lambda/2n_2$ which is disposed in the vicinity of the middle of the multilayer structure, where $n_1$ is the refractive index of the high refractive index dielectric films, $n_2$ is the refractive index of the low refractive index dielectric films and $\lambda$ is the oscillation wavelength of the laser device.

Materials that may be used for the high refractive index dielectric films include a-Si (amorphous silicon), whereas those that may be used for the low refractive index dielectric films include $SiO_x$, $SiN_x$ and $Al_2O_3$.

According to still another aspect of the invention, there is provided a laser module comprising a semiconductor laser device having an active layer and a resonator, characterized in that the reflector disposed at the optical emission end and/or the one disposed at the opposite end of the resonator have a reflectivity that increases with wavelength within the oscillation wavelength band between $\lambda_1$ and $\lambda_2$, where $\lambda\lambda_1$ is the oscillation wavelength at the lowest operating temperature and $\lambda_2$ is the oscillation wavelength at the highest operating temperature of the device, a current-applying means for injecting an electric current into the semiconductor laser device, a gauging means for gauging the temperature or for determining the current-voltage relationship of the semiconductor laser device to control the electric current injected into the device and a control means for controlling the electric current injected into the semiconductor laser device according to the output of the gauging means.

A laser module according to the invention may have preferable modes of realization particularly in terms of the active layer, the reflectors disposed at the opposite ends of the resonator and/or other components of the semiconductor laser device it comprises.

[Function]

If the resonator of a semiconductor laser device is a Fabry-Prot resonator, the oscillation wavelength of the resonator shifts to the long wavelength side as the device temperature rises with a temperature coefficient of 4 to 5 Å/°C.

If such is the case, the threshold current of the device rises for laser oscillation as a function of temperature rise to reduce the quantum efficiency and the gain G as defined by formula (2) above.

To avoid this problem, the resonator loss total has to be reduced as a function of temperature rise. In a semiconductor laser device according to the invention, the reflectivities $R_1$ and $R_2$ at the opposite ends of the resonator as defined by formula (4) above increases with the temperature rise of the device.

In other words, the reflectors disposed at the opposite ends of the resonator of a semiconductor laser device according to the invention have respective reflectivities that increase with the oscillation wavelength of the device within a range ($\lambda_1$ to $\lambda_2$) as a function of the operating temperature of the device. Therefore, the resonator loss total of the device falls as a function of temperature rise to offset the above problem.

Particularly when each of the reflectors of the resonator of a semiconductor laser device according to the invention has a dielectric multilayer structure, the device operates highly effectively and efficiently.

Since a reflector comprising a dielectric multilayer structure has a minimal point in the wave dependency curve of its energy reflectivity, the above requirements can be met when the minimal point has a wavelength of $\lambda_1$ or less.

Since a laser module according to the invention comprises as a principal component an improved semiconductor laser device according to the invention, its operation can be controlled simply by gauging the device temperature or determining the current-voltage relationship of the device and controlling the bias current on the basis of the obtained device temperature or current-voltage relationship. With such an arrangement, the optical output of the module can be controlled highly effectively and efficiently.

The quenching ratio of the device remains substantially unchanged without controlling the modulation current of the semiconductor laser device because the light emitting efficiency of the device does not fluctuate as described above.

Additionally, a laser module according to the invention may operate satisfactorily if the temperature change in the semiconductor laser device of the module is neglected because the device has a low temperature dependency and hence a low threshold current level for laser oscillation.

If such is the case, the laser module will not lose its reliability because the average output level and the quenching ratio of the module do not fluctuate significantly.

Since a laser module according to the invention has advantageous features as described above, it can operate without a Peltier device, a monitor/optical receiver, a control circuit for quick processing operation and other elements that are required for conventional laser modules. Consequently, a laser module according to the invention is downsized and manufactured at reduced cost.

Now, the present invention will be described in greater detail by referring to the accompanying drawings that illustrate preferred embodiment of the invention.

DETAILED DESCRIPTION OF THE INVENTION

[Embodiments]

Firstly, a preferred embodiment of semiconductor laser device according to the invention and illustrated in FIG. 1 will be described.

Figure 1:
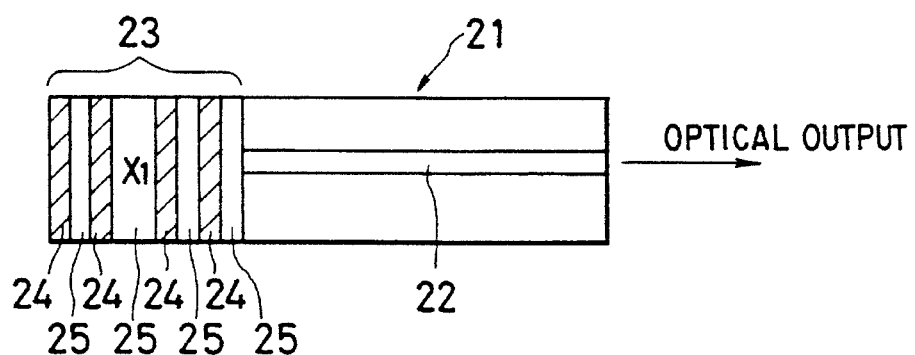
FIG. 1 is a schematic sectional view of a preferred embodiment of semiconductor laser device according to the invention.

Referring to FIG. 1, the semiconductor laser device 21 comprises components of known types except the reflector 23 disposed at an end of the resonator 22.

In a semiconductor laser device 21 according to the invention, the optical waveguide normally operates as an active layer and the device often has a double heterostructure having a carrier injection/confinement mechanism and at the same time a confinement waveguide mechanism for the photoelectric field distribution.

A combination of a heterojunction and a pn-junction or a two-dimensional heterojunction may be used for carrier injection, whereas a gain type waveguide having a one-dimensional heterostructure, a combination of a one-dimensional heterostructure and a refractive index type waveguide or a two-dimensional refractive index type waveguide having a two-dimensional heterostructure (BH type: Buried Heterostructure) may be used for confining the photoelectric field distribution.

Some of the semiconductor laser devices 21 of different types that can be used for the purpose of the present invention are listed below.

(A) GAIN-WAVELENGTH TYPE INCLUDING BOTH THE PLANAR AND NARROW STRIPE TYPES.

(1) diffusion stripe type semiconductor laser device
(2) proton stripe type semiconductor laser device
(3) V-channel type semiconductor laser device
(4) narrow stripe type semiconductor laser device (B) REFRACTIVE INDEX WAVEGUIDE TYPE (1) TJS type semiconductor laser device (Transverse Junction Stripe)
(2) BMQW type semiconductor laser device (Buried Multi-Quantum Well Heterostructure)
(3) SCD type semiconductor laser device (Semicylindrical Zn-Diffused Stripe)
(4) VSIS type semiconductor laser device (V-channeled Substrate Stripe)
(5) SF-VSIS type semiconductor laser device (Stress Free V-channeled Substrate Inner Stripe)

(6) ECO type semiconductor laser device (Embedded Confining Layer on Optical Guide)
(7) CNS type semiconductor laser device (Channeled Narrow Stripe)
(8) CSP type semiconductor laser device (Channeled Substrate Planar Structure)
(9) IRW type semiconductor laser device (Inverted Rib Waveguide)
(10) PCW type semiconductor laser device (Plano Convex Waveguide)
(11) CDH type semiconductor laser device (Constricted Double Hetero-Junction)

(C) REFRACTIVE INDEX WAVEGUIDE TYPE (1) BTRS type semiconductor laser device (Buried Twin-Ridge Substrate)
(2) TRS type semiconductor laser device (Twin-Ridge Substrate)
(3) TS type semiconductor laser device (Terraced Substrate)

A semiconductor laser device 21 according to the invention is prepared by forming an active layer on a semiconductor substrate (semiinsulator substrate) and a number of layers required for the device and selected from a light confinement layer, a current confinement layer, a lower clad layer, a guide layer, an upper clad layer, a contact layer, a cap layer and other layers are formed around the active layer. Then, a p-electrode and an n-electrode are arranged on respective predetermined positions of the semiconductor laser device 21.

A quantum well layer such as a single-layered quantum well layer, a multilayered quantum well layer, a single-layered strained quantum well layer or a multilayered quantum well layer is preferably used for the active layer, while the light confinement layer preferably has an SCH structure or a GRIN-SCH structure.

The semiconductor substrate may be selected from a group of known types including the InP type and the GaAs type.

A p-type layer of a compound of the III-V groups containing mixed crystal thereof, an n-type layer, a doped layer, a nondoped and/or a combination of any of these may be appropriately formed on the semiconductor substrate.

An alloy containing Au is typically used for the p- and n-electrodes. Alloys that can be used for the p-electrode include Au-Zn, Au-Be, Au-Cr and Au-Pt-Ti while the n-electrode may be typically made of an alloy such as Au-Ge-Ni or Au-Sn.

The semiconductor laser device 21 is prepared by means one of VPE (vapor phase epitaxy) including MOCVD (metal organic thermal decomposition growth), LPE (liquid phase epitaxy) and MBE (molecular beam epitaxy) combined with dry etching including photolithography and/or wet etching and metal bonding.

Referring to FIG. 1, the semiconductor laser device 21 comprises a reflector 23 disposed at an end (opposite to the end for optical emission) of the resonator 22 which is made of a noncrystalline dielectric film containing Si as a principal ingredient.

While the reflector 23 may be made of a single dielectric film, it is preferable that it has a multilayer structure of a dielectric material. More preferably, the reflector 23 has a multilayer structure comprising dielectric films having a high refractive index 24 and those having a low refractive index 25.

The reflector 23 of FIG. 1 comprises a plurality of pairs of dielectric films, each having a high refractive index dielectric film 24 and a low refractive index dielectric film 25 to produce a multilayer structure.

The high refractive index dielectric films 24 may, for example, be made of a-Si (amorphous silicon) while the low refractive index dielectric films 25 may be made of a material selected from $SiO_x$, $SiN_x$ and $Al_zO_3$.

If the refractive index of the high refractive index dielectric films 24 is $n_1$, the refractive index of the low refractive index semiconductor laser device 25 is $n_2$ and the oscillation wavelength of the semiconductor laser device is $\lambda$, the high refractive index dielectric films have a film thickness of $\lambda/4n_1$ and the low refractive index dielectric film 25 with (x) in FIG. 1 has a film thickness of $\lambda/2n_2$, whereas all the remaining low refractive index dielectric films 25 have a film thickness of $\lambda/4n_2$, the low refractive index dielectric index film having a film thickness of $\lambda/2n_2$, being located approximately in the middle of the multilayer structure.

A reflector 23 having a multilayer structure of high refractive index dielectric films and low refractive index dielectric films is formed on an end of the resonator 22 typically by means of an electron beam evaporation system provided with an optical monitor.

A semiconductor laser device 21 as illustrated in FIG. 1 will be specifically described by way of an example.

In this example, the resonator 22 is 300 μm long.

An quantum well type active layer is formed on an InP semiconductor substrate and comprises a GaInAs P barrier layer having a thickness of 120 Å and a band gap wavelength $\lambda_g=1.1$ μm and a GaInAsP well layer having a thickness of 60 Å and a band gap wavelength $\lambda_g=1.37$ μm.

If the semiconductor laser device 21 of this example is operated in a temperature range of 25° to 85° C., it has an oscillation wavelength $\lambda_1$ of 1.30 μm for the lowest operating temperature or 25° C., and an oscillation wavelength $\lambda_2$ of 1.33 μm for the highest operating temperature or 85° C.

The reflector 23 comprises three pairs of a high refractive index dielectric film 24 and a low refractive index dielectric film 25, where the high refractive index dielectric films 24 are made of a-Si and the low refractive index dielectric films 25 are made of $SiO_2$.

The dielectric films 24 and 25 have different film thicknesses defined in terms of $\lambda(=1.30$ μm), $n_1$ and $n_2$, which are $\lambda/4n_1$, $\lambda/2n_2$ and $\lambda/4n_2$, respectively.

Figure 2:
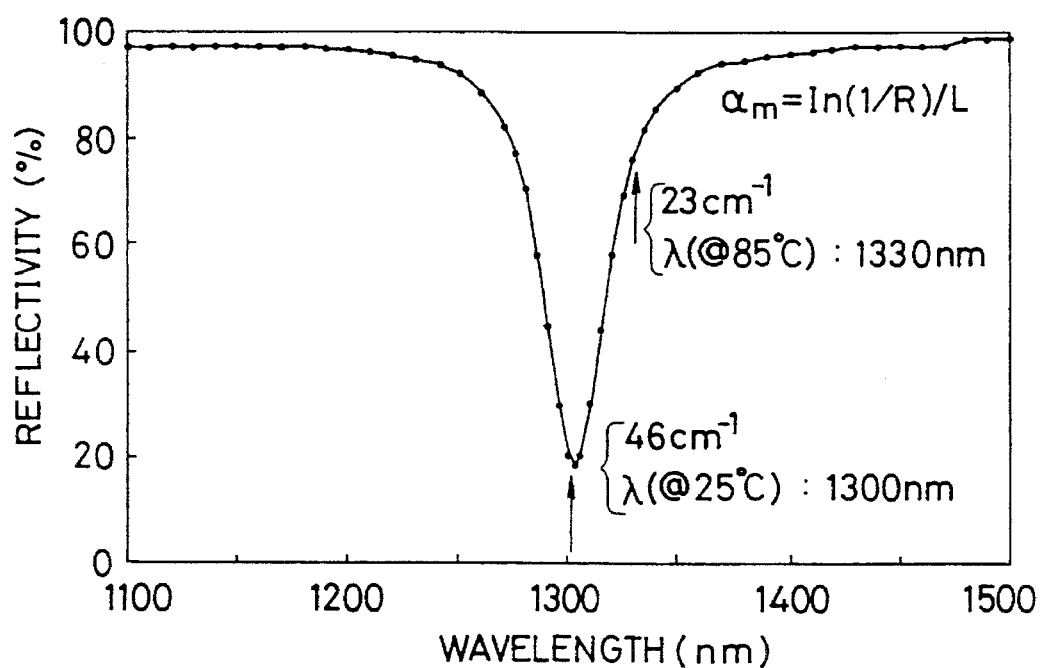
FIG. 2 is a graph showing the relationship between the reflectivity and the wavelength of a reflector of the embodiment of semiconductor laser device of FIG. 1.

FIG. 2 shows the wavelength dependency of the reflectivity and the reflectivity loss of the reflector 23 of the semiconductor laser device 21 of the above example.

It is seen from FIG. 2 that the reflectivity of the reflector 23 of this example is approximately 20% at operating temperature of 25° C. and for an oscillation wavelength of 1.30 μm and 75% at operating temperature of 85° C. and for an oscillation wavelength of 1.33 μm.

The semiconductor laser device 21 having such a reflector 23 at an end of the resonator 22 shows a mirror loss of approximately 46 cm$^{-1}$ at operating temperature of 25° C. and 23 cm$^{-1}$ at operating temperature of 85° C.

Figure 3:
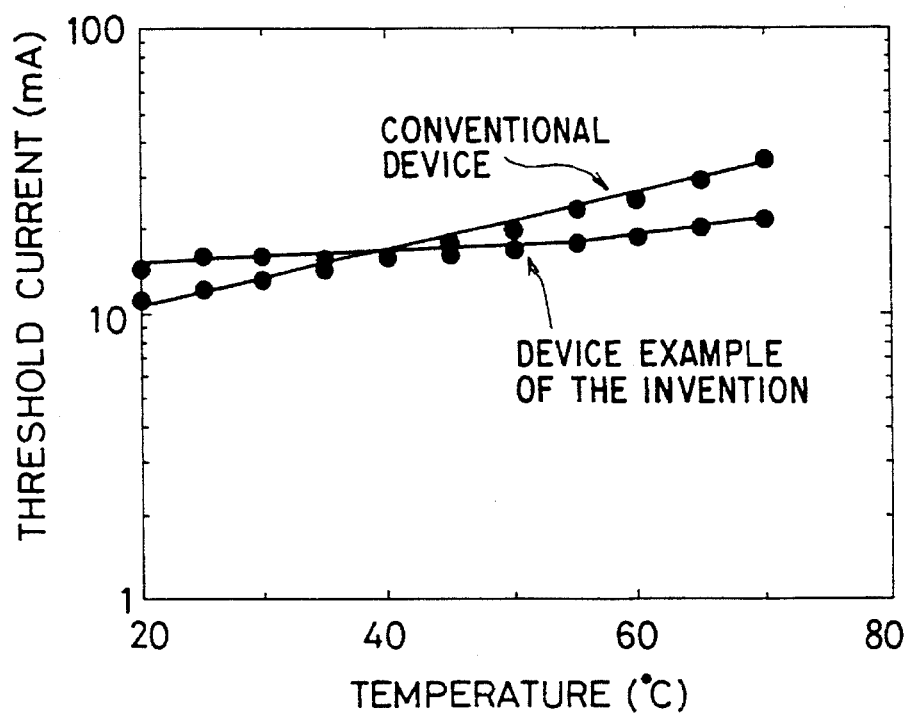
FIG. 3 is a graph showing the temperature dependency of the oscillation threshold current of a semiconductor laser device according to the invention and that of a conventional semiconductor laser device.

FIG. 3 shows the temperature dependency of the oscillation threshold current of the semiconductor laser device 21 of the above example and that of a conventional double side cleavage type semiconductor laser device.

As seen from FIG. 3, the device of the above example has a threshold current that remains substantially constant regardless of any rise in the operating temperature, whereas the conventional device shows a sharp rise in the threshold current in response to a rise in the operating temperature.

While the device of the above example has a $T_0=100K$ and a differential quantum efficiency (η) ratio {η(85° C.)/η(25° C.)}=0.95, the corresponding values of the conventional device are as low as $T_0=50K$ and (η) ratio=0.6, respectively.

Thus, a semiconductor laser device 21 according to the present invention has temperature-related characteristics that are remarkably improved when compared with comparable conventional devices.

It is to be noted here that the number of pairs of high and low refractive index dielectric films 24 and 25 of the multilayer structure of a semiconductor laser device according to the invention is not necessarily limited to three and may alternatively be one, two, four or more than four.

Therefore, the number of pairs of dielectric films of the reflector 23 of the device of the above example may be modified, if appropriate.

Now, an embodiment of semiconductor laser device according to the invention will be described by referring to FIG. 4.

Figure 4:
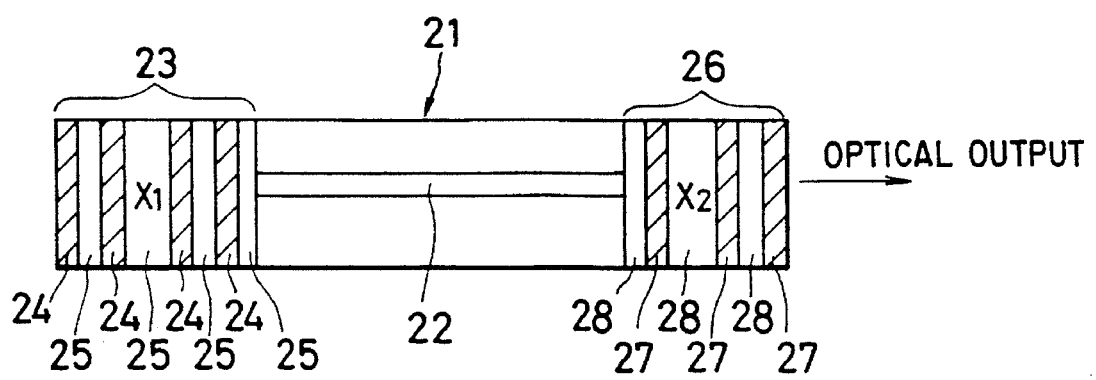
FIG. 4 is a schematic sectional view of another preferred embodiment of semiconductor laser device according to the invention.

The semiconductor laser device 21 illustrated in FIG. 4 is the same as that of FIG. 1 except that it has a pair of reflectors 23, 26 disposed at the opposite ends (the end for optical emission and the one opposite to it) of the resonator 22. The reflector 23 is entirely identical with its counterpart of the device of FIG. 1 in technological terms and the reflector 26 is entirely identical with the reflector 23 and hence compatible with the latter.

Therefore, the semiconductor laser device 21 of FIG. 4 will be described below mainly from the viewpoint of the difference of the two devices.

As in the case of FIG. 1, the reflector 23 of the semiconductor laser device 21 of FIG. 4 located at an end (the end opposite to the one for optical emission) of the resonator 22 comprises a multilayer structure of a plurality of pairs of dielectric films, each having a high refractive index dielectric film 24 and a low refractive index dielectric film 25.

If the refractive index of the high refractive index dielectric films 24 is $n_1$, the refractive index of the low refractive index dielectric films 25 is $n_2$ and the oscillation wavelength of the dielectric films 24 and 25 is $\lambda$, the high refractive index dielectric films have a film thickness of $\lambda/4n_1$ and the low refractive index dielectric film 25 with ($x_1$) in FIG. 4 has a film thickness of $\lambda/2n_2$, whereas all the remaining low refractive index dielectric films 25 have a film thickness of $\lambda/4n_2$, the low refractive index dielectric index film having a film thickness of $\lambda/2n_2$ being located approximately in the middle of the multilayer structure.

The reflector 26 of the semiconductor laser device 21 of FIG. 4 located at the other end (the end for optical emission) of the resonator 22 comprises a multilayer structure of a plurality of pairs of dielectric films, each having a high refractive index dielectric film 27 and a low refractive index dielectric film 28.

If the refractive index of the high refractive index dielectric films 27 is $n_2$, the refractive index of the low refractive index dielectric films 28 is $n_2$ and the oscillation wavelength of the dielectric films 27 and 28 is $\lambda$, the high refractive index dielectric films have a film thickness of $\lambda/4n_1$ and the low refractive index dielectric film 28 with ($x_2$) in FIG. 4 has a film thickness of $\lambda/2n_z$ whereas all the remaining low refractive index dielectric films 28 have a film thickness of $\lambda/4n_2$, the low refractive index dielectric index film having a film thickness of $\lambda/2n_2$ being located approximately in the middle of the multilayer structure.

The high refractive index dielectric films 24 and 27 are made of a same material, while the low refractive index dielectric films 25 and 28 are made of a same material.

The reflectivity of the reflector 26 is preferably, but not necessarily, lower than that of th other reflector 23.

Preferably, the reflectivity of the reflector 26 is not higher than 40% for the oscillation wavelength of $\lambda_1$ and not lower than 70% for the oscillation wavelength of $\lambda_2$, whereas the reflectivity of the reflector 23 is not higher than 50% for the oscillation wavelength of $\lambda_1$ and not lower than 80% for the oscillation wavelength of $\lambda_2$.

A semiconductor laser device 21 as illustrated in FIG. 4 will be specifically described by way of an example.

In this example, the resonator 22 is 300 μm long.

An quantum well type active layer is formed on an InP semiconductor substrate and comprises a GaInAs P barrier layer having a thickness of 120 Å and a band gap wavelength $\lambda_g=1.1$ μm and a GaInAsP well layer having a thickness of 60 Å and a band gap wavelength $\lambda_g=1.37$ μm.

If the semiconductor laser device 21 of this example is operated in a temperature range of 20° to 120° C., it has an oscillation wavelength $\lambda_1$ of 1.310 μm for the lowest operating temperature or 20° C., an oscillation wavelength of 1.325 μm for an intermediary temperature of 70° C., and an oscillation wavelength $\lambda_1$ of 1.340 μm for the highest operating temperature or 120° C.

The reflector 23 comprises four pairs of a high refractive index dielectric film 24 and a low refractive index dielectric film 25, where the high refractive index dielectric films 24 are made of a-Si and the low refractive index dielectric films 25 are made of $SiO_2$.

The dielectric films 24 and 25 have different film thicknesses defined in terms of $\lambda(=1.30$ μm), $n_1$ and $n_2$, which are $\lambda/4n_1$, $\lambda/2n_2$ and $\lambda/4n_2$, respectively.

The other reflector 26 comprises three pairs of a high refractive index dielectric film 27 and a low refractive index dielectric film 28, where the high refractive index dielectric films 27 are made of a-Si and the low refractive index dielectric films 28 are made of $SiO_2$.

The dielectric films 27 and 28 have different film thicknesses defined in terms of $\lambda(=1.30$ μm), $n_1$ and $n_2$, which are $\lambda/4n_1$, $\lambda/2n_2$, and $\lambda/4n_2$, respectively.

Figure 5:
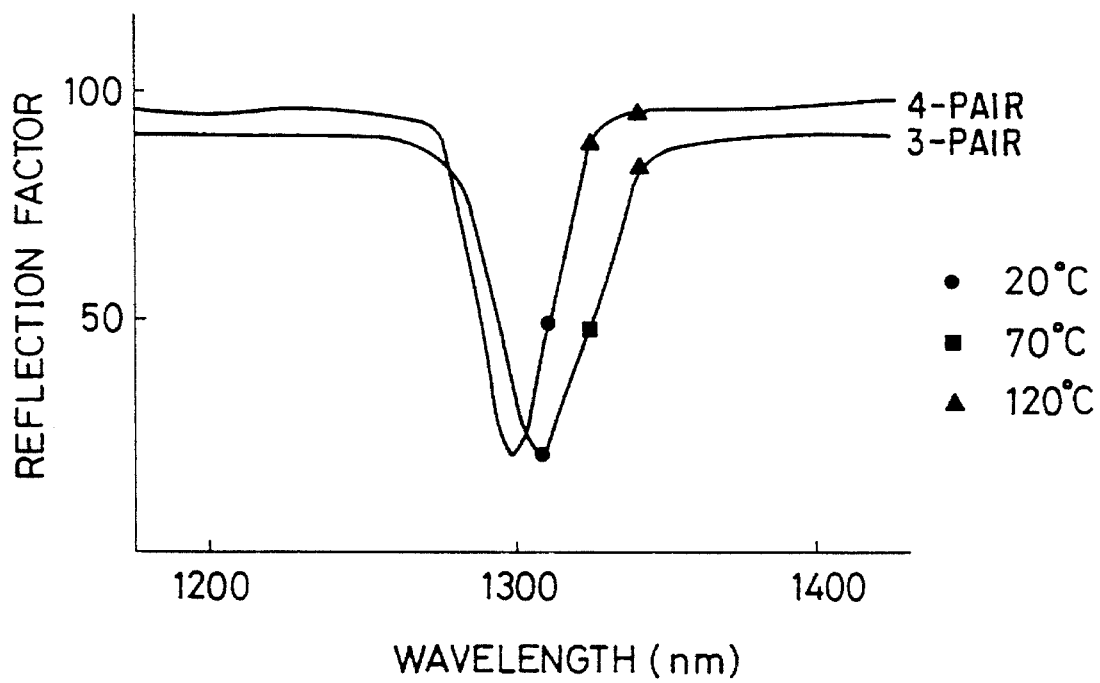
FIG. 5 is a graph similar to that of FIG. 2 but showing the relationship between the reflectivity and the wavelength of a reflector of the embodiment of semiconductor laser device of FIG. 1.

FIG. 5 shows the wavelength dependency of the reflectivity loss of the reflectors 23 and 26 of the semiconductor laser device 21 of the above example.

It is seen from FIG. 5 that the reflectivities of the reflectors 23 and 26 of this example are approximately 50% and 20%, respectively at operating temperature of 20° C. and for an oscillation wavelength of 1.310 μm, approximately 90% and 45%, respectively at operating temperature of 70° C. and for an optical wavelength of 1.325 μm and approximately 97% and 80%, respectively at operating temperature of 120° C. and for an oscillation wavelength of 1.340 μm.

The semiconductor laser device 21 having reflectors 23 and 26 at the respective ends of the resonator 22 shows a mirror loss of approximately 38 $cm^{-1}$ at operating temperature of 20° C., 15 $cm^{-1}$ at operating temperature of 70° C. and 4 $cm^{-1}$ at operating temperature of 120° C.

The remarkable performance of the semiconductor laser device 21 of FIG. 4 is attributable to the fact that the losses in the parameters including the gain G and the threshold current density Jo that are given rise to by temperature rise in operation are compensated by the reflector 23 in a low temperature range and by the reflector 26 in a high temperature range.

Since the resonator 22 of the semiconductor laser device 21 of FIG. 4 is provided with an additional reflector 26 beside the reflector 23, it has improved To and g ratio, if compared with the device of FIG. 1.

Now, an embodiment of laser module according to the invention will be described by referring to FIG. 6.

Figure 6:
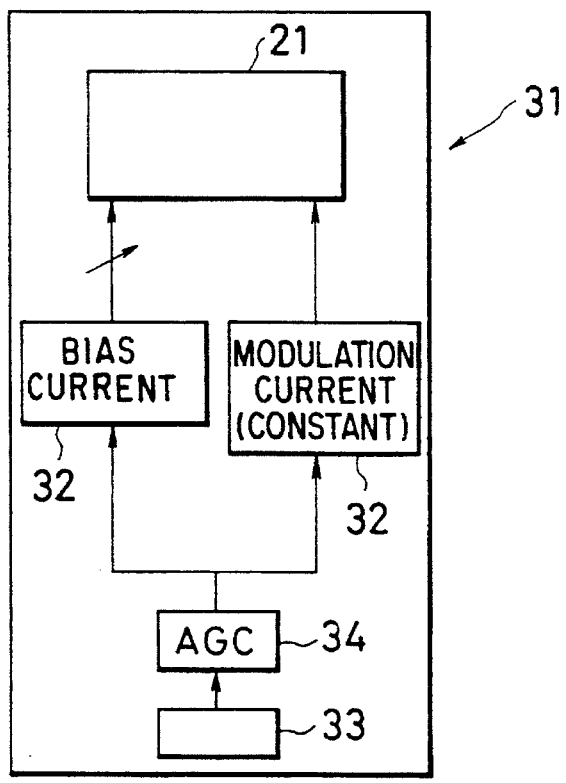
FIG. 6 is a schematic sectional view of a preferred embodiment of laser module according to the invention.

The laser module of FIG. 6 typically comprises a semiconductor laser device 21 as illustrated in FIG. 1, a current applying means 32, a gauging means 33 and a control means, which are electrically or electronically connected to form an open loop type drive circuit.

Said current applying means 32 is for injecting an electric current into to the semiconductor laser device 21 and comprises known electric circuits.

Said gauging means 33 is for controlling the electric current injected into the semiconductor laser device 21. The gauging means 33 may be a temperature gauge (of any known type) for gauging the temperature of the semiconductor laser device 21 or a gauge (of any known type) for gauging the current-voltage relationship in the semiconductor laser device 21.

Said control means 34 is of any known type, which may be an AGC circuit.

In the laser module 31 of FIG. 6, an electric current is injected into the semiconductor laser device 21 by the current applying means 33 to make it operate for laser oscillation, while the gauging means 33 gauges the temperature of the semiconductor laser device 21 during the laser oscillation and the control means 34 controls the bias current to the semiconductor laser device 21 in accordance to the signal it receives from the gauging means 34.

Figure 7:
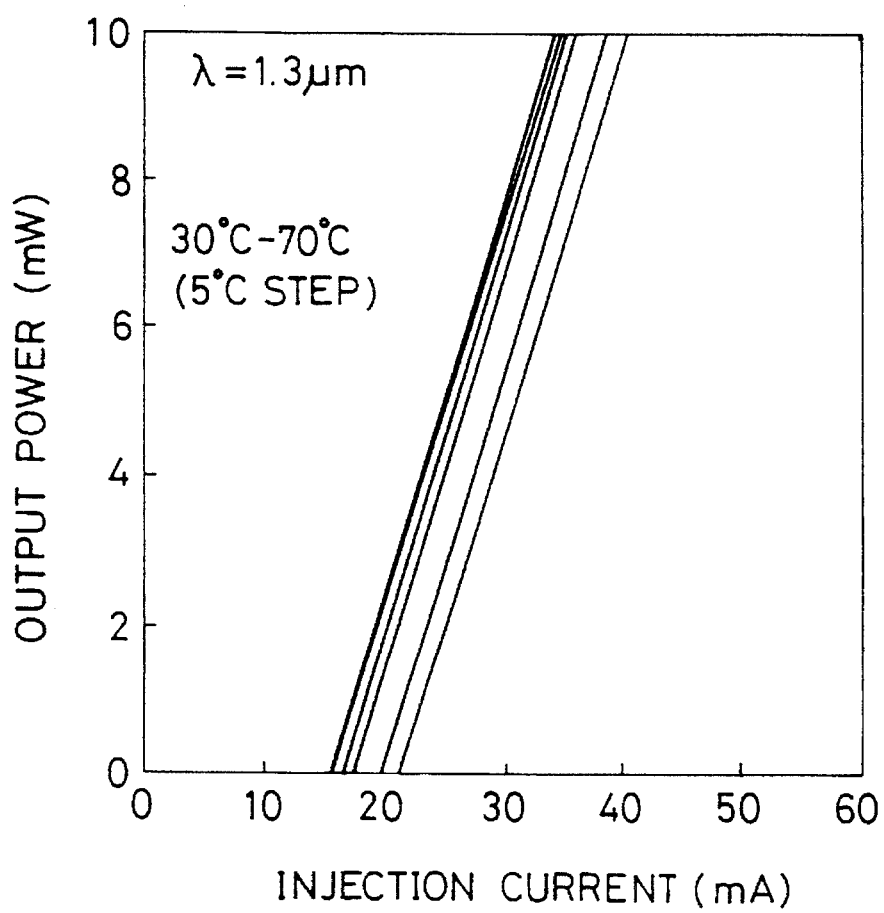
FIG. 7 is a graph showing the relationship between the electric current and the optical output and its temperature dependency of the embodiment of laser module of FIG. 6.
Figure 10:
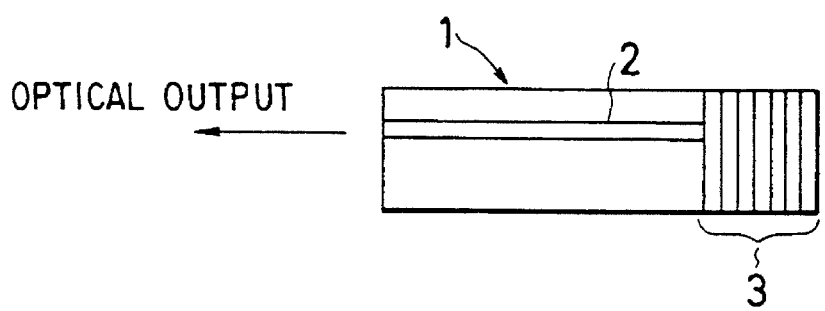
FIG. 10 is a schematic sectional view of a conventional semiconductor laser device.
Figure 8:
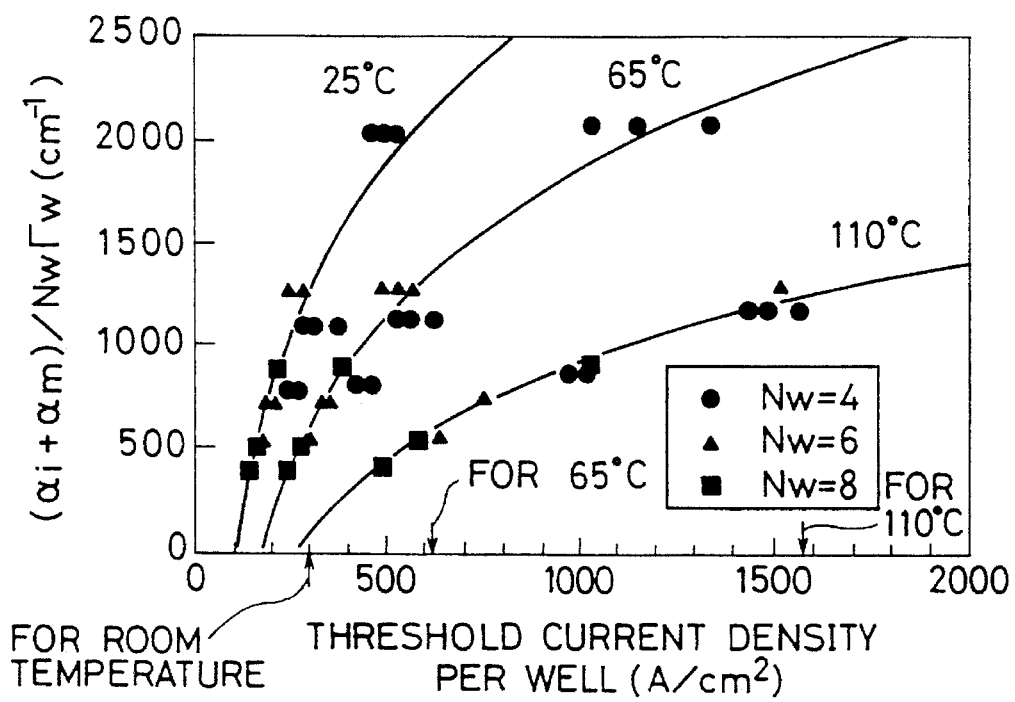
FIG. 8 is a graph showing different values for the gain of a quantum well type semiconductor laser device observed in an experiment.
Figure 9:
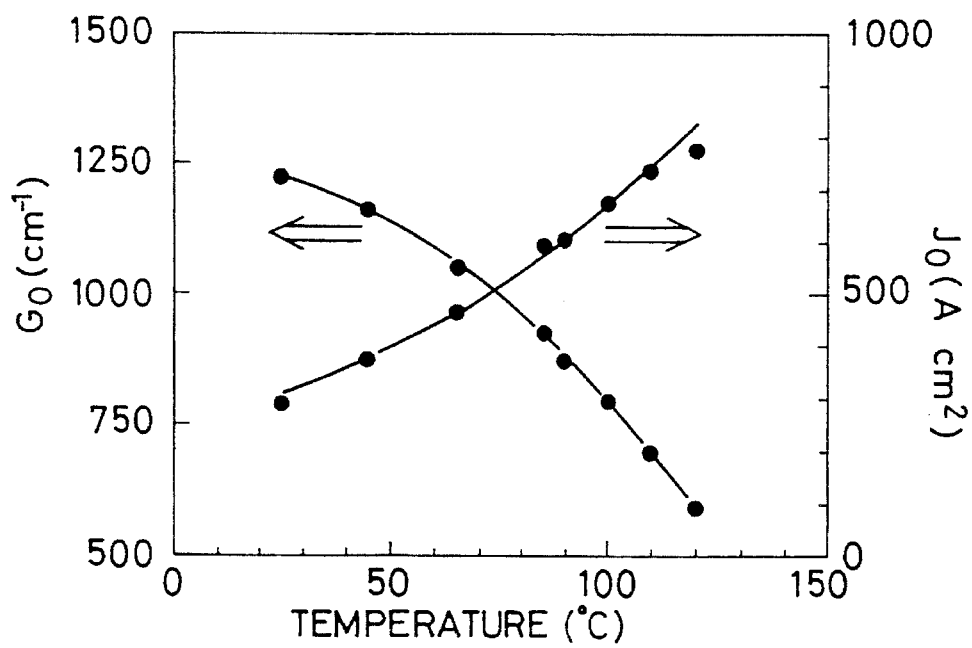
FIG. 9 is a graph showing the temperature dependency of the gain coefficient and the transparency coefficient of a quantum well type semiconductor laser device observed in an experiment.
Figure 11:
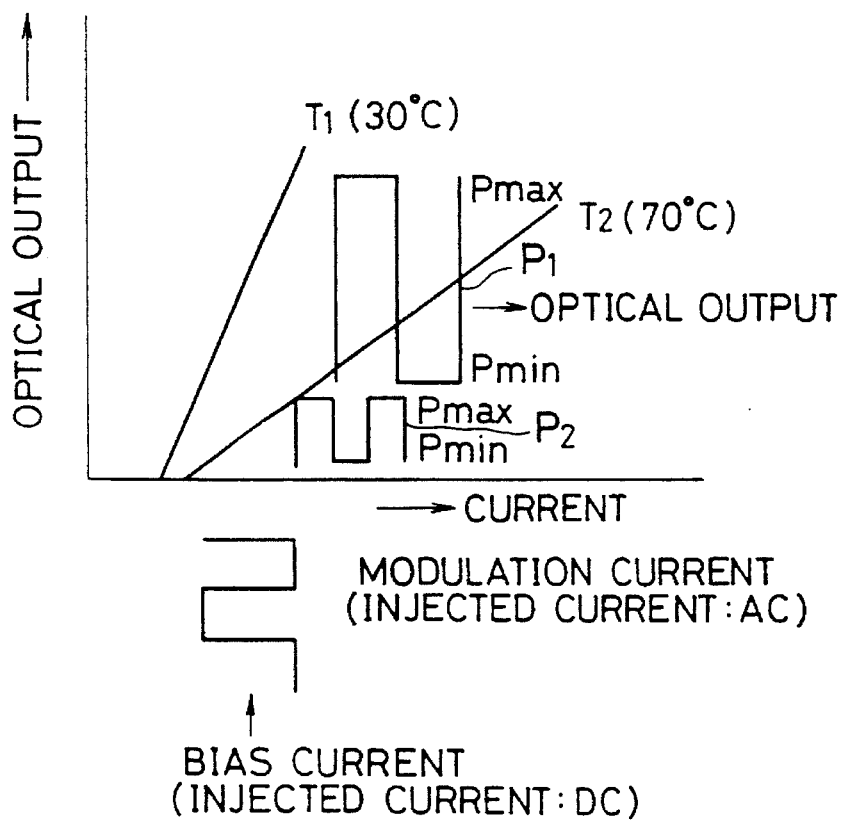
FIG. 11 is a graph showing the relationship among the current, the optical output and the temperature of a conventional laser module when an injection signal is applied to it.
Figure 12:
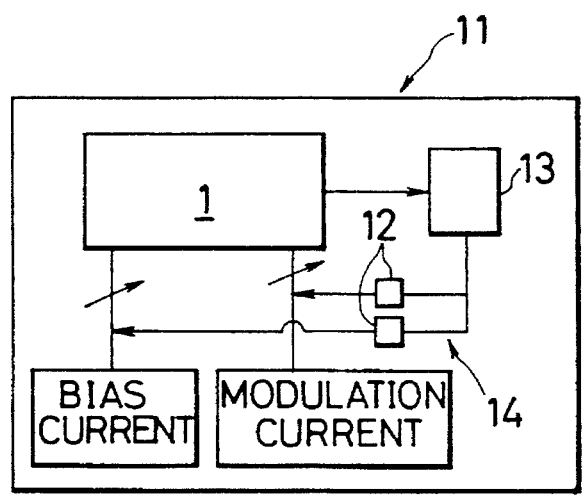
FIG. 12 is a schematic block diagram of a conventional laser module.

FIG. 7 shows the relationship between the injected current that changes for each temperature rise of 5° C. of the semiconductor laser device 21 and the laser output of the laser module, when the semiconductor laser device 21 has a single reflector 23 at an end of the resonator 22 (k=1.3 µm) and operates in a temperature range of 30° to 70° C.

Since the laser module is provided with an improved semiconductor laser device 21, it operates satisfactorily for laser oscillation simply by gauging the temperature of the semiconductor laser device 21 and controlling the bias current as a function of the obtained temperature. Additionally, since the semiconductor laser device 21 does not change its emission efficiency, the quenching ratio of the device does not show any significant change, if the modulation current to the device 21 is not controlled.

The operation of the above described laser module may effectively be controlled by gauging not the temperature but the current-voltage relationship of the device 21 by a gauging means 33 and controlling the semiconductor laser device 21 by a control means according to the signal transmitted from the gauging means 33.

The performance of the above described laser module will be further improved, if the semiconductor laser device 21 having a cofiguration as illustrated in FIG. 1 is replaced by a semiconductor laser device 21 of FIG. 4, because the latter operates more satisfactorily than the former.

[Advantages of the Invention]

In a semiconductor laser device according to the invention and comprising a single reflector, the reflector disposed at an end of the resonator has a reflectivity that increases with the oscillation wavelength of the device within a range ($\lambda_1$ to $\lambda_2$) as a function of the operating temperature of the device. Therefore, the resonator loss of the device falls as a function of temperature rise to offset the above problem and improve the temperature dependency of the device.

Therefore, a semiconductor laser device according to the invention can suppress any increase in the threshold current and, at the same time, any fall in the quantum efficiency and the gain during laser oscillation without relying an on external circuit so that a downsized semiconductor laser device having an improved controllability can be produced at reduced cost.

In a semiconductor laser device according to the invention and comprising a pair of reflectors, the reflector disposed at the opposite ends of the resonator have respective reflectivities that increase with the oscillation wavelength of the device within a range ($\lambda_1$ to $\lambda_2$) as a function of the operating temperature of the device. Therefore, the resonator loss of the device falls better than the above device to offset the above problem and improve the temperature dependency of the device. Therefore such an semiconductor laser device is more advantageous than the above described device in terms of prevention of increased threshold current for laser oscillation and decreased quantum efficiency and gain. Thus, it will be advantageous for downsizing, cost reduction and controllability.

Since a laser module according to the invention comprises as a principal component an improved semiconductor laser device according to the invention, it has a low threshold current for laser oscillation and its average output and quenching ratio do not significantly fluctuate. Additionally, its operation can be controlled simply by gauging the device temperature or determining the current-voltage relationship of the device and controlling the bias current on the basis of the obtained device temperature or current-voltage relationship.

With such an arrangement, the optical output of the module can be controlled highly effectively and efficiently and the module can operate without a Peltier device, a monitor/optical receiver, a control circuit for quick processing operation and other elements that are required for conventional laser modules so that consequently, a laser module according to the invention is can be downsized and manufactured at reduced cost.

What is claimed is:

1. A semiconductor laser device comprising an active layer and a resonator having a single reflector, characterized in that the reflector is disposed at the end opposite to the optical emission end of the resonator and has a reflectivity that increases with wavelength within the oscillation wavelength band between $\lambda_1$ to $\lambda_2$, where $\lambda_1$ is the oscillation wavelength at the lowest operating temperature and $\lambda_2$ is the oscillation wavelength at the highest operating temperature of the device, the reflectivity of said reflector disposed at the end opposite to the optical emission end is 50% or less for the oscillation wavelength of $\lambda_1$ and 70% or more for the oscillation wavelength of $\lambda_2$.

2. A semiconductor laser device according to claim 1, wherein the active layer is a quantum well layer or a strained quantum well layer and the reflector disposed at the optical emission end and/or the reflector disposed at the opposite end thereof have reflectivities that increase with wavelength within the oscillation wavelength band between $\lambda_1$ to $\lambda_2$.

3. A semiconductor laser device comprising an active layer and a resonator having a pair of reflectors, characterized in that one of the reflectors is disposed at the optical emission end and the other reflector is disposed at the opposite end of the resonator and each have reflectivities that increase with wavelength within the oscillation wavelength band between $\lambda_1$ to $\lambda_2$, where $\lambda_1$ is the oscillation wavelength at the lowest operating temperature and $\lambda_2$ is the oscillation wavelength at the highest operating temperature of the device, the reflectivity of said reflector disposed at the end opposite to the optical emission end is 50% or less for the oscillation wavelength of $\lambda_1$ and 70% or more for the oscillation wavelength of $\lambda_2$.

4. A semiconductor laser device according to claim 3, wherein the reflector disposed at the optical emission end of the device has a reflectivity smaller than that of the reflector disposed at the device. opposite end of the resonator over the entire operating temperature range of the 5. A semiconductor laser device according to claim 4, wherein the reflectivity of the reflector disposed at the optical emission end of the resonator is 40% or less for the oscillation wavelength $\lambda_1$ and 70% or more for the oscillation wavelength $\lambda_2$, while the reflectivity of the reflector disposed at the opposite end is 50% or less for the oscillation wavelength $\lambda_1$ and 80% or more for the oscillation wavelength $\lambda_2$.

6. A semiconductor laser device according to claim 3, wherein the reflectors of the semiconductor laser device have a multilayer structure of a dielectric material.

7. A semiconductor laser device according to claim 3, wherein the dielectric multilayer structure of the reflectors comprises dielectric films having a high refractive index and dielectric films having a low refractive index.

8. A semiconductor laser device according to claim 7, wherein the dielectric multilayer structure comprises a plurality of pairs of dielectric films, each having a high refractive index dielectric film and a low refractive index dielectric film.

9. A semiconductor laser device according to claim 7, wherein the dielectric multilayer structure comprises high refractive index dielectric films having a film thickness of $\lambda/4n_1$, low refractive index dielectric films having a film thickness of $\lambda/4n_2$ and a low refractive index dielectric film having a film thickness of $\lambda/2n_2$ which is disposed in the vicinity of the center of the middle of the multilayer structure, where $n_1$ is the refractive index of the high refractive index dielectric films, $n_2$ is the refractive index of the low refractive index dielectric films and $\lambda$ is the oscillation wavelength of the semiconductor laser device.

10. A semiconductor laser device according to claim 6, wherein the materials that may be used for the high refractive index dielectric films include a-Si (amorphous silicon), whereas those that may be used for the low refractive index dielectric films include $SiO_x$, $SiN_x$ and $Al_2O_3$.

* * * * *